(12) United States Patent
Ohtsuki

(10) Patent No.: US 12,183,641 B2
(45) Date of Patent: Dec. 31, 2024

(54) METHOD FOR EVALUATING SEMICONDUCTOR SUBSTRATE

(71) Applicant: SHIN-ETSU HANDOTAI CO., LTD., Tokyo (JP)

(72) Inventor: Tsuyoshi Ohtsuki, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 434 days.

(21) Appl. No.: 17/634,365

(22) PCT Filed: Jun. 4, 2020

(86) PCT No.: PCT/JP2020/022038
§ 371 (c)(1),
(2) Date: Feb. 10, 2022

(87) PCT Pub. No.: WO2021/044682
PCT Pub. Date: Mar. 11, 2021

(65) Prior Publication Data
US 2022/0285228 A1    Sep. 8, 2022

(30) Foreign Application Priority Data

Sep. 3, 2019  (JP) ................................ 2019-160135

(51) Int. Cl.
*H01L 21/66* (2006.01)
*H01L 27/146* (2006.01)

(52) U.S. Cl.
CPC ........ *H01L 22/14* (2013.01); *H01L 27/14683* (2013.01)

(58) Field of Classification Search
None
See application file for complete search history.

(56) References Cited

U.S. PATENT DOCUMENTS

2021/0159259 A1*  5/2021  Abe ................. H01L 27/14616

FOREIGN PATENT DOCUMENTS

JP   H05-041439 A   2/1993
JP   H10-190941 A   7/1998
(Continued)

OTHER PUBLICATIONS

Aug. 11, 2020 International Search Report issued in International Patent Application No. PCT/JP2020/022038.
(Continued)

*Primary Examiner* — Hsien Ming Lee
(74) *Attorney, Agent, or Firm* — Oliff PLC

(57) ABSTRACT

A method for evaluating electrical characteristics of a semiconductor substrate, the method including the steps of: forming a p-n junction on a surface of the semiconductor substrate; mounting the semiconductor substrate on a wafer chuck provided with an equipment for performing light irradiation on the surface of the semiconductor substrate and an equipment for measuring the quantity of the light for the irradiation; performing light irradiation on the surface of the semiconductor substrate for a predetermined time; and measuring an amount of carriers generated after the light irradiation of the p-n junction at least after turning off the light irradiation. This provides a method for evaluating a semiconductor substrate that allows the same evaluation in a wafer state as when an actual solid-state image sensor has been formed without producing a device by using process equipment when evaluating characteristics corresponding to residual image characteristics of a wafer.

9 Claims, 2 Drawing Sheets

(56) References Cited

FOREIGN PATENT DOCUMENTS

JP       2019-009212 A    1/2019
JP        2019009212    *   1/2019  ............ H01L 21/66

OTHER PUBLICATIONS

T. Kaneda et al.; "Analysis of a residual image in CMOS image sensor 1"; the 77th Japan Society of Applied Physics Autumn Meeting, Meeting Proceedings; Sep. 2006; 14p-P6-10.
A. Ohtani et al.; "Analysis of a residual image in CMOS image sensor 2"; the 77th Japan Scoeity of Applied Physics Autumn Meeting, Meeting Proceedings; Sep. 2006; 14p-P6-11.
S. Rein; "Lifetime Spectroscopy"; Springer; 2005; pp. 398.

* cited by examiner

[FIG. 1]
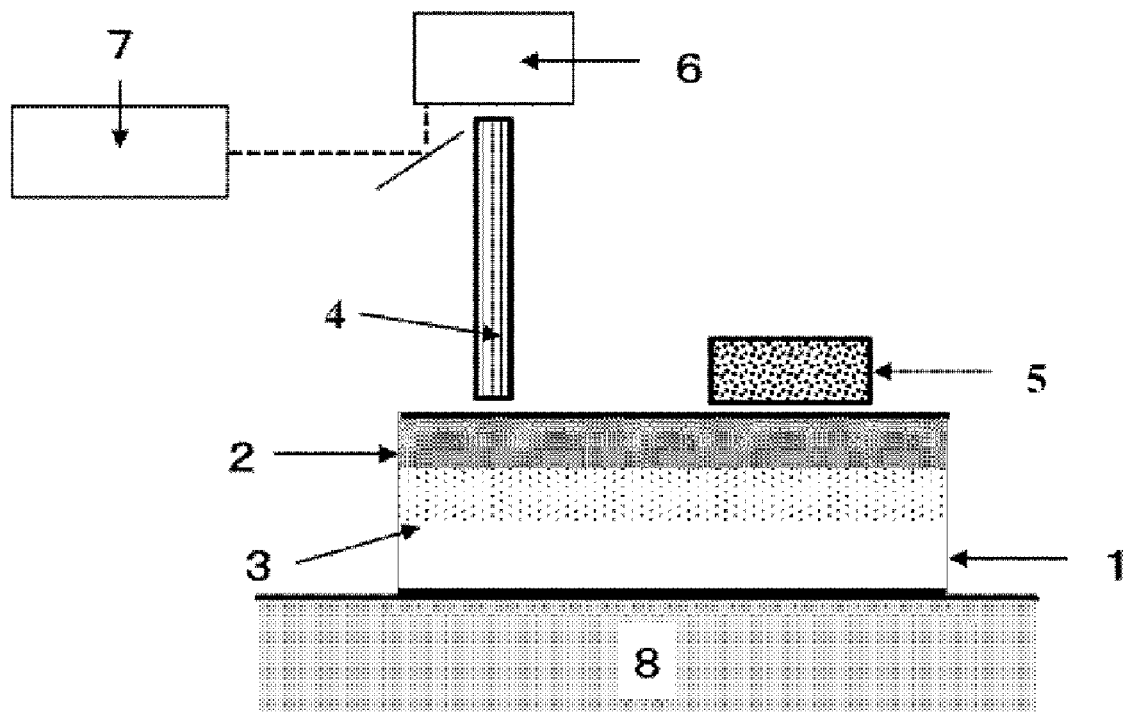
[FIG. 2]
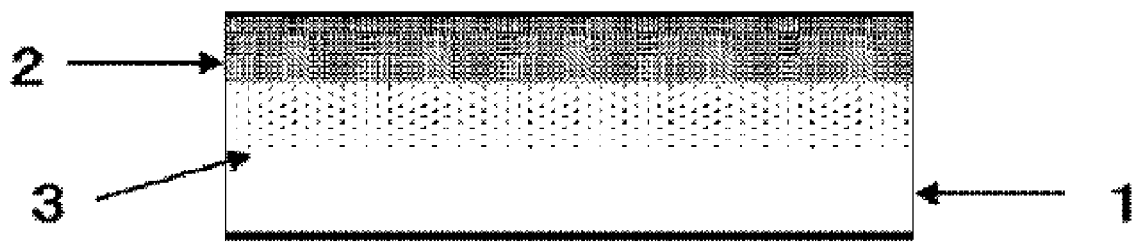

[FIG. 3]
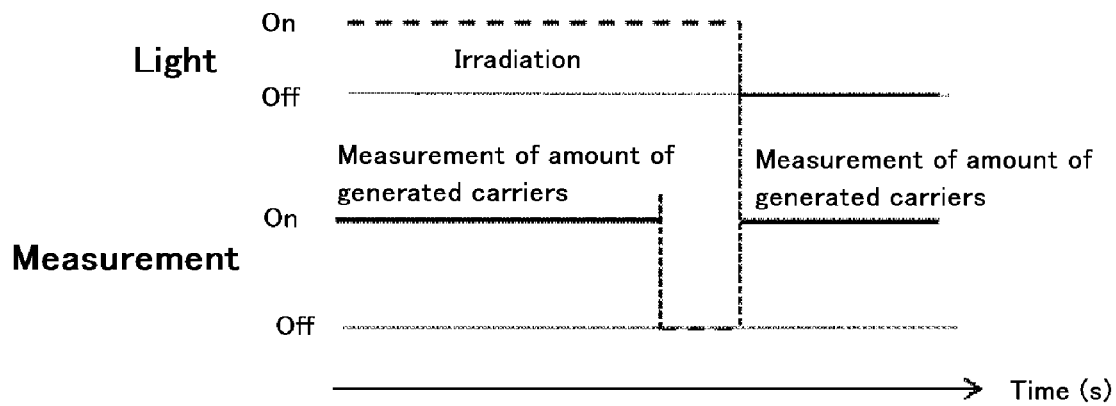
[FIG. 4]
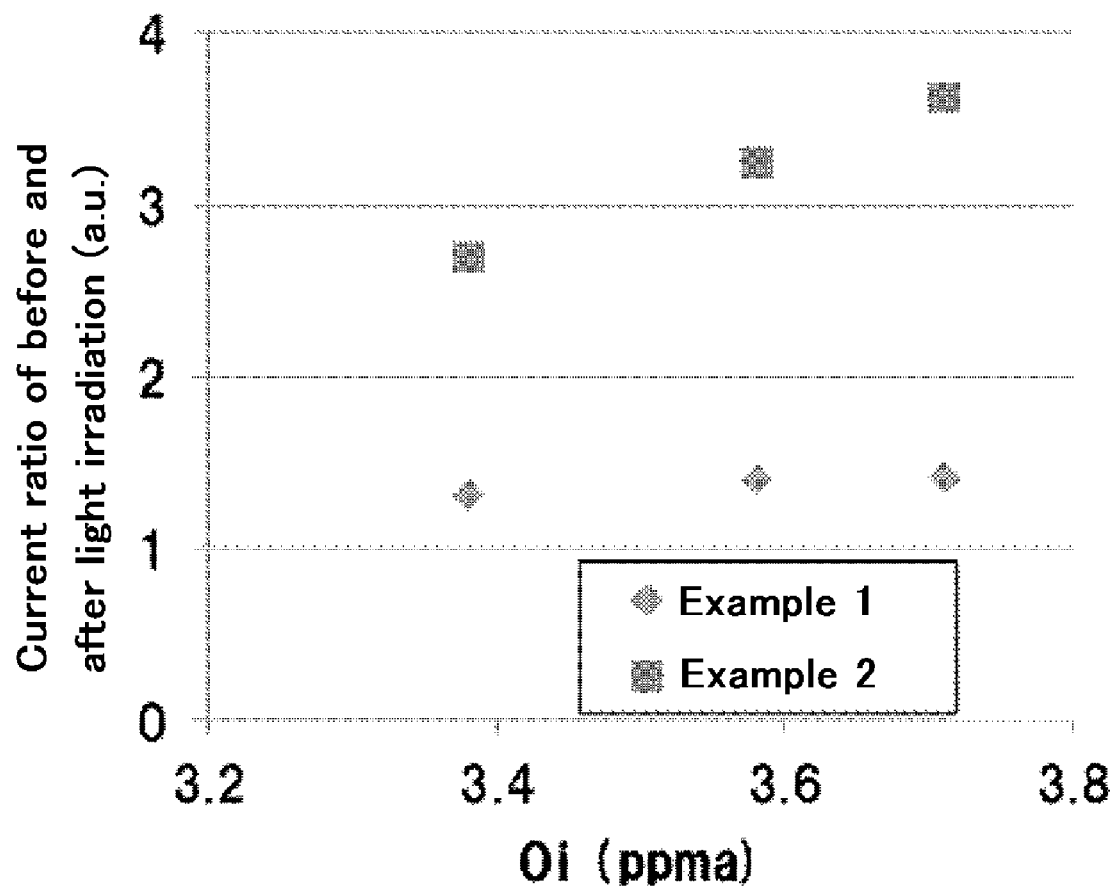

METHOD FOR EVALUATING SEMICONDUCTOR SUBSTRATE

TECHNICAL FIELD

The present invention relates to a method for evaluating a semiconductor substrate.

BACKGROUND ART

As miniaturization and higher performance of semiconductor devices such as solid-state image sensors including memories and CCDs (Charge-Coupled Devices) advance, silicon wafers as materials are also required to have higher quality in order to improve the yield of such products. Accordingly, various silicon wafers that meet this requirement are being developed. In particular, the crystallinity at a surface layer portion of a wafer is assumed to affect the characteristics of a product directly and is important. To improve the crystallinity, the following have been developed: 1) an annealed wafer that has been heat-treated at a high temperature in an atmosphere containing an inert gas or hydrogen; 2) a defect-free polished wafer having reduced grown-in defects by the improvement of pulling conditions; 3) an epitaxial wafer obtained by epitaxial growth; and the like.

As a conventional method for evaluating the electrical characteristics of the surface quality of a silicon wafer, the evaluation of the dielectric breakdown strength of an oxide film (GOI) has been employed. This is carried out as follows: a gate oxide film is formed on a surface of a silicon wafer by thermal oxidation; electrical stress is applied to the silicon oxide film, which is an insulator, by forming an electrode on the oxide film; and the surface quality of the silicon wafer is evaluated by the degree of insulation. That is, if defects and metal impurities are present on the surface of the original silicon wafer, these are taken into the silicon oxide film by the thermal oxidation, or an oxide film corresponding to the surface shape is formed resulting in an uneven insulator, and so forth. Thus, if defects or impurities are present, insulating property is degraded. The conventional method makes use of such characteristics to evaluate the surface quality of a silicon wafer.

In an actual device, this is the reliability evaluation of a gate oxide film of a MOSFET (metal-oxide-semiconductor field-effect transistor), and various wafers have been developed for improvement thereof. However, device yields may be degraded as a matter of course even if there are no problems in the GOI evaluation. In particular, such phenomena have increased in recent years accompanying higher integration of devices. Especially in solid-state image sensors, when considering the improvement of sensitivity by reducing dark current, for example, the reduction of leakage current caused by the wafer leads to the reduction of dark current, and in the end, contributes to the improvement of device characteristics.

Meanwhile, when metallic contamination is a cause, trace metal has come to have an influence accompanying the higher performance of devices in recent years. In results of chemical analysis, various metals have come to be detected by efforts to achieve higher sensitivity. However, the present situation is that it is extremely difficult to grasp which of the metal elements detected in the chemical analysis has the greatest influence on an actual device or junction leakage. In addition, metal impurity analysis is a technique of, for example, etching a wafer surface and analyzing the etching solution. Therefore, the information of the wafer surface is analyzed as a representative, and generally, it is not possible to obtain information on in-plane distribution. On the other hand, in an evaluation of leakage current, many p-n junctions are formed on a silicon substrate surface and the reverse leakage current of each p-n junction is determined. Thus, the leakage distribution in the substrate plane can be obtained.

Solid-state image sensors such as CCD and CMOS (Complementary MOS) image sensors have different ways of extracting the electric charge generated by electron-hole pairs that are generated by incidence of light. However, the principle for converting light to an electric charge (photoelectric conversion) is to form a p-n junction and have a depletion layer as a structure, and is the same. Here, the phenomenon that electron-hole pairs are produced in a depletion layer due to the presence of defects or impurities and an electric charge is generated even though there is no incidence of light is called white flaw or dark current. The reverse leakage current characteristics of a wafer having a p-n junction formed in this manner can be evaluated by a dark current in a solid-state image sensor, and can be used as an index for improvement in the assumption of a cause or development of materials.

However, besides dark current, residual image characteristics are known as material characteristics that affect a solid-state image sensor. It is known that residual image characteristics have a close relationship with materials, especially the substrate (Non Patent Document 1 and Non Patent Document 2). For example, Non Patent Document 1 and Non Patent Document 2 state that light elements in a silicon substrate have an effect on residual image characteristics, and that the defects that have the effect are composites of boron and oxygen. Since the influence of the substrate on the residual image characteristics have become clear as described, a method for evaluating a substrate that deals with residual image characteristics has become necessary besides the evaluation of reverse leakage current characteristics, which corresponds to dark current evaluation, in order to evaluate substrate characteristics.

A method described in Patent Document 1 is one such method, but in order to perform this method, it is necessary to form a photodiode, which is a light-receiving portion of a solid-state image sensor. For this purpose, the formation of an element isolation structure is necessary besides the diffusion of a dopant. In order to form this element isolation structure, process equipment for performing photolithography, a subsequent etching process, etc. is necessary. Furthermore, to perform an evaluation, time and large-scale facilities are necessary. As described, in order to evaluate residual image characteristics, the production of an actual device has conventionally been essential, and there has been a problem that evaluation in a wafer state is difficult.

CITATION LIST

Patent Literature

Patent Document 1: JP 2019-9212 A

Non Patent Literature

Non Patent Document 1: The 77th Japan Society of Applied Physics Autumn Meeting, Meeting Proceedings, 14p-P6-10, Tasuku Kaneda, Akira Ohtani, "Analysis of a residual image in CMOS image sensor 1"

Non Patent Document 2: The 77th Japan Society of Applied Physics Autumn Meeting, Meeting Proceedings, 14p-P6-

11, Akira Ohtani, Tasuku Kaneda, "Analysis of a residual image in CMOS image sensor 2"

Non Patent Document 3: S. Rein "Lifetime Spectroscopy" p398, Springer, 2005

SUMMARY OF INVENTION

Technical Problem

The present invention has been made in view of the above-described problem. An object of the present invention is to allow the same evaluation in a wafer state as when an actual solid-state image sensor has been formed without producing a device by using process equipment when evaluating characteristics corresponding to residual image characteristics of a wafer to be used in products that require high yields such as CCD and CMOS image sensors. Another object is to contribute to the achievement of higher quality in semiconductor substrates by allowing simple measurement on a wafer level in such a manner.

Solution to Problem

To achieve the object, the present invention provides a method for evaluating electrical characteristics of a semiconductor substrate, the method comprising the steps of:

forming a p-n junction on a surface of the semiconductor substrate;

mounting the semiconductor substrate on a wafer chuck provided with an equipment for performing light irradiation on the surface of the semiconductor substrate and an equipment for measuring the quantity of the light for the irradiation;

performing light irradiation on the surface of the semiconductor substrate for a predetermined time; and measuring an amount of carriers generated after the light irradiation of the p-n junction at least after turning off the light irradiation.

According to such a method, poor residual image characteristics due to the semiconductor substrate, which are regarded with concern in CCD, CMOS image sensors, etc. can be evaluated simply and with high precision on a substrate level, and a high-quality semiconductor substrate can be provided.

In this event, an amount of carriers generated during the light irradiation of the p-n junction is preferably measured in the step of performing light irradiation.

By measuring the amount of carriers generated during the light irradiation, it is possible to avoid more certainly the difference in the amount of carriers generated to start with affecting the residual image characteristics.

Furthermore, in this event, the amount of carriers generated during the light irradiation and the amount of carriers generated after the light irradiation are preferably measured with a carrier measuring probe that is provided separately from the equipment for performing light irradiation and the equipment for measuring the quantity of the light for the irradiation.

According to such a method, the measurement can be performed more simply.

In this case, the carrier measuring probe is preferably a non-contact Kelvin probe.

As the carrier measuring probe, a non-contact Kelvin probe can be used suitably.

Alternatively, in this case, the carrier measuring probe is preferably a mercury probe.

As the carrier measuring probe, a mercury probe can also be used suitably.

In addition, the semiconductor substrate is preferably subjected to a heat treatment in advance after the step of forming the p-n junction and before the step of mounting the semiconductor substrate.

By subjecting the semiconductor substrate to a heat treatment in advance, it is possible to form and grow defects of the semiconductor substrate to make the poor residual image characteristics more apparent. It is also possible to reproduce the behavior in a heat treatment in a device process.

Furthermore, a semiconductor substrate for a solid-state image sensor is preferably used as the semiconductor substrate, and residual image characteristics of the solid-state image sensor are preferably evaluated from a ratio of the amount of carriers generated after the light irradiation to the amount of carriers generated during the light irradiation.

The production of carriers during light irradiation varies depending on the type of the semiconductor substrate. However, according to such a method, standardization is possible by obtaining the ratio of the amount of carriers generated after the light irradiation to the amount of carriers generated during the light irradiation, so that evaluation is possible regardless of the type of the semiconductor substrate.

Advantageous Effects of Invention

According to the inventive method for evaluating a semiconductor substrate, poor residual image characteristics due to the semiconductor substrate, which are regarded with concern in CCD, CMOS image sensors, etc. can be evaluated simply and with high precision on a substrate level, and a high-quality semiconductor substrate can be provided.

BRIEF DESCRIPTION OF DRAWINGS

FIG. 1 is a schematic view showing an example of an embodiment of the present invention.

FIG. 2 is a diagram showing an example of a junction structure formed in the inventive method for evaluating a semiconductor substrate.

FIG. 3 is a diagram showing an example of a measurement sequence of the inventive method for evaluating a semiconductor substrate.

FIG. 4 is a graph showing the relationship between: the ratio of the amount of carriers generated after the light irradiation to the amount of carriers generated during the light irradiation in Example 1 and Example 2; and the concentration of oxygen in the substrate.

DESCRIPTION OF EMBODIMENTS

As described above, a method for evaluating a semiconductor substrate has been required that makes it possible to measure, on a substrate level, characteristics corresponding to residual image characteristics of a semiconductor substrate to be used in products that require high yields such as CCD and CMOS image sensors.

To achieve the object, the present inventor has earnestly studied and found out that the following method can solve the above-described problem. That is, a method for evaluating electrical characteristics of a semiconductor substrate, the method comprising the steps of:

forming a p-n junction on a surface of the semiconductor substrate;

mounting the semiconductor substrate on a wafer chuck provided with an equipment for performing light irradiation on the surface of the semiconductor substrate and an equipment for measuring the quantity of the light for the irradiation;

performing light irradiation on the surface of the semiconductor substrate for a predetermined time; and measuring an amount of carriers generated after the light irradiation of the p-n junction at least after turning off the light irradiation. Thus, the present invention has been completed.

Hereinafter, the present invention will be described with reference to the drawings, but the present invention is not limited thereto.

Firstly, a p-n junction structure is formed in a semiconductor substrate (the step of forming a p-n junction on a surface of the semiconductor substrate). The p-n junction structure is not particularly limited, and any p-n junction structure is possible, but preferably has the leakage current (surface component) caused by the p-n junction structure reduced as much as possible.

As an example of such a p-n junction structure, FIG. 2 shows an example of a junction structure formed in the inventive method for evaluating a semiconductor substrate. Such a junction structure can be produced, for example, as follows: boron or the like is diffused on a semiconductor substrate 1 doped with phosphorus or the like to form a high-concentration diffusion layer 2 having the opposite conductivity type to the semiconductor substrate 1; and a p-n junction is formed by making the semiconductor substrate 1 and the high-concentration diffusion layer 2, having opposite conductivity types from one another, contact. Here, electrons and holes near the p-n junction become combined to form a depletion layer 3, where carriers do not exist. Note that as stated above, FIG. 2 only shows an example for describing a p-n junction that can be formed in the present invention, and the conductivity type of the semiconductor substrate, the p-n junction structure, and so forth are not particularly limited.

To describe the inventive method for evaluating a semiconductor substrate, FIG. 1 shows an example of an embodiment of the present invention. The step of mounting the semiconductor substrate 1 having the p-n junction structure produced in the above manner on a wafer chuck 8 provided with an equipment (illumination) 6 for performing light irradiation and an equipment (illuminometer) 7 for measuring the quantity of light as in FIG. 1 is performed. Then, after performing a light irradiation 4 on the surface of the semiconductor substrate 1 at a predetermined illuminance for a predetermined time (the step of performing light irradiation), the step of measuring the amount of carriers generated after the light irradiation after turning off the light irradiation 4 is performed.

Here, it can be considered that it is preferable to use an illumination such as, for example, an LED having white light as the light irradiation 4, assuming the use of an actual device. However, when assuming a device that specializes in infrared light, for example, it is also possible to select a light source (illumination) having a wavelength adapted to the purpose. In addition, the quantity of light (illuminance) is desirably made not to vary from measurement to measurement. Accordingly, the illumination preferably has both a mechanism for measuring illuminance and a mechanism for adjusting illuminance.

In addition, regarding the quantity of light at the time of measurement, in an actual device, residual image characteristics are caused when a shutter is temporarily shut to obtain an image after the incidence of a strong light, and then the shutter is opened to obtain the next image. The carriers generated by the previous light are not sufficiently excluded, and the influence of the carriers remains. Therefore, it can be assumed that a comparatively strong quantity of light is necessary. In an actual test, it is necessary to search for the optimum illuminance in advance by altering the illuminance in some cases. However, it is generally sufficient to set the illuminance of a commercially available illumination to maximum. Specifically, the illuminance is preferably about 500 lux.

Furthermore, the time of the light irradiation is preferably 1 to 10 seconds, more preferably 3 to 7 seconds. When the time of the light irradiation is 1 second or more, it is possible to ensure time until the quantity of the light of the illumination becomes stable after turning on the light irradiation, and the illuminance can be made constant with more certainty. When the time is 10 seconds or less, the measurement time can be shortened.

In this manner, the amount of carriers generated in the formed p-n junction is measured. A conceptual diagram of the specific timings of the light irradiation and measurement is shown in FIG. 3. FIG. 3 is a diagram showing an example of a measurement sequence of the inventive method for evaluating a semiconductor substrate.

The present inventor understands that the generated amount of carriers owing to light irradiation 4 is affected by the kind of semiconductor substrate 1 or a light element contained in the semiconductor substrate 1, particularly carbon. For this reason, to avoid the original difference in the amount of generated carriers owing to light irradiation 4 affecting the residual image characteristics, the amount of carriers generated at this time (the amount of carriers generated during light irradiation) is preferably measured while performing the light irradiation as shown in FIG. 3. In this manner, the semiconductor substrate can be evaluated taking the original difference in the amount of generated carriers into consideration.

It is also preferable to turn off the light irradiation and measure the amount of generated carriers (the amount of carriers generated after light irradiation) again after measuring the amount of carriers generated during the light irradiation to determine the ratio of the amount of carriers generated after turning off the light irradiation to the amount of carriers generated during the light irradiation. The production of carriers during light irradiation varies depending on the type of the semiconductor substrate. However, standardization is possible by obtaining the ratio of the amount of carriers generated after the light irradiation to the amount of carriers generated during the light irradiation, so that evaluation is possible regardless of the type of the semiconductor substrate.

In addition, the time for measuring the amount of carriers generated after the light irradiation after turning off the light irradiation also depends on the performance of the measurement equipment. Therefore, it is desirable to carry out an inspection in advance. For example, the measurement time can be 1 second and accumulated.

In the present invention, the time between turning off the light irradiation and starting the measurement of the amount of carriers generated after the light irradiation is not particularly limited. The measurement may be started at the same time when turning off the light irradiation, or the measurement may be started after leaving a predetermined time after turning off the light irradiation. The measurement of the amount of carriers generated after the light irradiation is intended to grasp the phenomenon of carriers produced by the light irradiation becoming trapped and then released again, and the carriers that have been released again are measured. Here, the timing when the carriers are released again depends on the kind of the carrier traps and the measurement environment, and therefore, it is desirable to perform an inspection beforehand. For example, it is possible to begin the measurement at the same time as turning off the light irradiation, and carry out the measurement with a measurement time of 1 second, and so forth.

Furthermore, in FIG. 3, the reason for stopping the measurement once before measuring the amount of carriers generated after turning off the light irradiation is to avoid a noise with more certainty when the light irradiation is turned off. Therefore, the stop is not essential, and depending on the performance of the measuring equipment and the state of the object to be measured, the step is not necessarily needed.

The amount of carriers generated during the light irradiation and after the light irradiation is preferably measured with a carrier measuring probe 5 that is provided separately from the equipment for performing light irradiation and the equipment for measuring the quantity of the light for the irradiation as shown in FIG. 1. By using a non-contact Kelvin probe or a mercury probe as the carrier measuring probe 5, the measurement can be carried out more simply without device isolation or the like.

The residual image characteristics can then be evaluated from the ratio of the current value of the carrier measuring probe when the light irradiation is on and off. If the current value after turning off the light irradiation is high, it means that that many carriers are trapped, and it can be conjectured that the residual image characteristics are poor.

In examples of actual solid-state image sensors, an electric charge is generated by electron-hole pairs that are produced by incident light when a shutter is open, and an image is constructed by taking this in. After the shutter has shut, it is important for the electron-hole pairs to be quickly discharged, and if this is slow, this affects the next frame as a residual image.

In addition, sometimes, a clear difference cannot be achieved just by forming a p-n junction in the semiconductor substrate. In this case, the semiconductor substrate is preferably subjected to a heat treatment in advance after the step of forming the p-n junction. For example, it is effective to add a heat treatment for forming defects in the semiconductor substrate. Such a heat treatment makes it possible to form and grow defects in the semiconductor substrate to make poor residual image characteristics more apparent. Furthermore, residual image characteristics are, as stated in Non Patent Document 1 and Non Patent Document 2, said to be composites of boron and oxygen in a substrate, and it is also effective to carry out the measurement after performing the heat treatment in cases where these defects reproduce their behavior in a heat treatment in a device process. It is known that defects that are formed from clusters of light elements such as boron and oxygen are formed at comparatively low temperatures and become unstable at high temperatures. Therefore, the temperature of the additional heat treatment is preferably a comparatively low temperature of about 100 to 500° C. as in Non Patent Document 3.

According to such a method, poor residual image characteristics due to the semiconductor substrate, which are regarded with concern in CCD, CMOS image sensors, etc. can be evaluated simply and with high precision on a substrate level, and a high-quality semiconductor substrate can be provided.

EXAMPLE

Hereinafter, the present invention will be described more specifically with reference to Examples. However, the present invention is not limited to the following Examples.

Example 1

Using phosphorus-doped CZ silicon wafers having a resistivity of 10 Ω·cm and a diameter of 200 mm, three samples respectively having an oxygen concentration (Oi) in the substrate of 3.38, 3.58, and 3.71 ppma (JEITA) were prepared. To these silicon wafers, boron was ion-implanted at 10 KeV and a dosage of $6.0 \times 10^{13}$ atoms/cm$^2$. Then, the silicon wafers were subjected to recovery annealing at 1000° C. under a nitrogen atmosphere to form a p-n junction structure.

Next, in the measurement sequence shown in FIG. 3, the amount of generated carriers (current value) was measured with a non-contact Kelvin probe while performing a 1-second light irradiation. Subsequently, the light irradiation was turned off, and the current value was determined over 1 second in the same manner. Residual image characteristics were evaluated from the ratio of the current value (also called current ratio) of before and after the light irradiation. The results are shown in Table 1 and FIG. 4.

As a result, it can be observed that the higher the substrate oxygen concentration, the higher the current ratio and the poorer the residual image characteristics. A cause of residual image in a solid-state image sensor is said to be composites of boron and oxygen. It can be presumed that the present results show the following. Phosphorus-doped substrates were used and the concentration of boron was controlled by ion implantation. Therefore, the difference in the oxygen concentration in the semiconductor substrates determines the concentration of boron-oxygen composites. Therefore, the higher the oxygen concentration, the higher the concentration of boron-oxygen composites, and this affects residual image characteristics.

TABLE 1

| Oi (ppma) | Current ratio of before and after light irradiation (a.u.) |
|---|---|
| 3.38 | 1.32 |
| 3.58 | 1.41 |
| 3.71 | 1.43 |

Example 2

Next, in three samples obtained using CZ silicon wafers similar to those in Example 1, respectively having the same oxygen concentrations, p-n junction structures were formed by the same process as in Example 1. After that, with reference to Non Patent Document 1, annealing was performed at 450° C. under a nitrogen atmosphere for 70 hours. Then, the same measurement as in Example 1 was performed.

The relationship between the substrate oxygen concentration and current ratio after the annealing at 450° C. is shown in Table 2 and FIG. 4. The higher the substrate oxygen concentration, the higher the current ratio, and it can be observed that the residual image characteristics have become degraded. Moreover, the difference between the samples is greater when the annealing at 450° C. was performed than when the annealing was not performed.

Composites of boron and oxygen are said to cause residual image in solid-state image sensors, and it was shown that these defects grew owing to the annealing at 450° C. It was shown that poor residual image characteristics can be made more apparent by this heat treatment.

TABLE 2

| Oi (ppma) | Current ratio of before and after light irradiation (a.u.) |
|---|---|
| 3.38 | 2.70 |
| 3.58 | 3.25 |
| 3.71 | 3.63 |

It was revealed that by applying the inventive method in this manner, it is possible to evaluate residual image characteristics on a substrate level without using photolithography facilities or etching facilities by a technique that is simpler and swifter than in the past, and that the inventive method is effective as a method for evaluating a semiconductor substrate for a solid-state image sensor.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for evaluating electrical characteristics of a semiconductor substrate, the method comprising the steps of:
    forming a p-n junction on a surface of the semiconductor substrate;
    mounting the semiconductor substrate on a wafer chuck provided with an equipment for performing light irradiation on the surface of the semiconductor substrate and an equipment for measuring the quantity of the light for the irradiation;
    performing light irradiation on the surface of the semiconductor substrate for a predetermined time; and
    measuring an amount of carriers generated after the light irradiation of the p-n junction at least after turning off the light irradiation, wherein
    an amount of carriers generated during the light irradiation of the p-n junction is measured in the step of performing light irradiation, and
    the amount of carriers generated during the light irradiation and the amount of carriers generated after the light irradiation are measured with a carrier measuring probe that is provided separately from the equipment for performing light irradiation and the equipment for measuring the quantity of the light for the irradiation.

2. The method for evaluating a semiconductor substrate according to claim 1, wherein the carrier measuring probe is a non-contact Kelvin probe.

3. The method for evaluating a semiconductor substrate according to claim 2, wherein the semiconductor substrate is subjected to a heat treatment in advance after the step of forming the p-n junction and before the step of mounting the semiconductor substrate.

4. The method for evaluating a semiconductor substrate according to claim 2, wherein a semiconductor substrate for a solid-state image sensor is used as the semiconductor substrate, and residual image characteristics of the solid-state image sensor are evaluated from a ratio of the amount of carriers generated after the light irradiation to the amount of carriers generated during the light irradiation.

5. The method for evaluating a semiconductor substrate according to claim 1, wherein the carrier measuring probe is a mercury probe.

6. The method for evaluating a semiconductor substrate according to claim 5, wherein the semiconductor substrate is subjected to a heat treatment in advance after the step of forming the p-n junction and before the step of mounting the semiconductor substrate.

7. The method for evaluating a semiconductor substrate according to claim 5, wherein a semiconductor substrate for a solid-state image sensor is used as the semiconductor substrate, and residual image characteristics of the solid-state image sensor are evaluated from a ratio of the amount of carriers generated after the light irradiation to the amount of carriers generated during the light irradiation.

8. The method for evaluating a semiconductor substrate according to claim 1, wherein the semiconductor substrate is subjected to a heat treatment in advance after the step of forming the p-n junction and before the step of mounting the semiconductor substrate.

9. The method for evaluating a semiconductor substrate according to claim 1, wherein a semiconductor substrate for a solid-state image sensor is used as the semiconductor substrate, and residual image characteristics of the solid-state image sensor are evaluated from a ratio of the amount of carriers generated after the light irradiation to the amount of carriers generated during the light irradiation.

* * * * *